United States Patent
Chen et al.

(10) Patent No.: US 11,231,870 B1
(45) Date of Patent: Jan. 25, 2022

(54) MEMORY SUB-SYSTEM RETIREMENT DETERMINATION

(71) Applicant: Micron Technology, Inc., Boise, ID (US)

(72) Inventors: Mikai Chen, Sunnyvale, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/990,928

(22) Filed: Aug. 11, 2020

(51) Int. Cl.
*G06F 3/00* (2006.01)
*G06F 3/06* (2006.01)
*G11C 13/00* (2006.01)
*G11C 16/04* (2006.01)

(52) U.S. Cl.
CPC .......... *G06F 3/0653* (2013.01); *G06F 3/0619* (2013.01); *G06F 3/0673* (2013.01); *G11C 13/0021* (2013.01); *G11C 16/0483* (2013.01)

(58) Field of Classification Search
CPC ............. G06F 11/3034; G06F 11/3452; G06F 11/3485; G06F 11/3495; G06F 2201/88; G06F 3/061; G06F 3/0653; G06F 3/0659; G06F 3/0673; G06F 13/4213; G06F 11/362; G06F 12/0246; G06F 2212/7211

USPC .................. 711/E12.003, E12.079, 103, E12
See application file for complete search history.

(56) References Cited

U.S. PATENT DOCUMENTS

| | | | |
|---|---|---|---|
| 7,844,879 B2 | 11/2010 | Ramamoorthy et al. | |
| 8,207,557 B2 | 6/2012 | Sills et al. | |
| 9,170,897 B2* | 10/2015 | Losh | G06F 11/1068 |
| 9,419,215 B2 | 8/2016 | Meade | |
| 9,819,365 B2 | 11/2017 | Shepard | |
| 2015/0149816 A1* | 5/2015 | Antonakopoulos | G06F 11/076 714/6.11 |
| 2016/0133671 A1 | 5/2016 | Fantini et al. | |

* cited by examiner

*Primary Examiner* — Thong Q Le
(74) *Attorney, Agent, or Firm* — Brooks, Cameron & Huebsch, PLLC

(57) ABSTRACT

A method includes performing a quantity of write cycles on memory components. The method can further include monitoring codewords, and, for each of the codewords including a first error parameter value, determining a second error parameter value. The method can further include determining a probability that each of the codewords is associated with a particular one of the second error parameter values at the first error parameter value and determining a quantity of each of the codewords that are associated with each of the determined probabilities. The method can further include determining a statistical boundary of the quantity of each of the codewords and determining a correlation between the quantity of write cycles performed and the corresponding determined statistical boundary of the quantity of each of the codewords.

20 Claims, 9 Drawing Sheets

MEMORY SUB-SYSTEM RETIREMENT DETERMINATION

TECHNICAL FIELD

Embodiments of the disclosure relate generally to memory sub-systems, and more specifically, relate to memory sub-system retirement determination.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
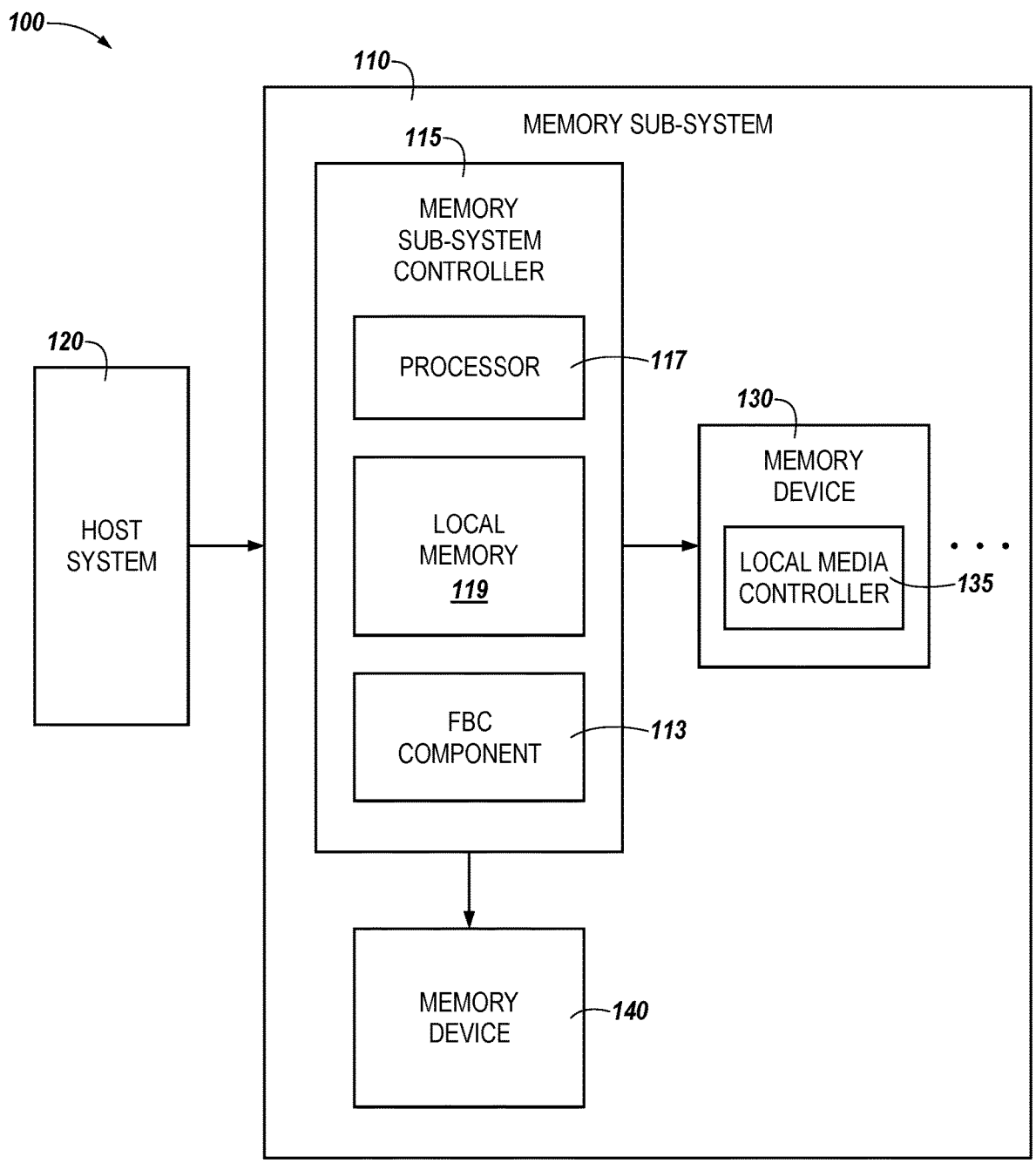
FIG. 1 illustrates an example computing system that includes a memory sub-system in accordance with some embodiments of the present disclosure.

Aspects of the present disclosure are directed to memory sub-system retirement determination, in particular to memory sub-systems that include a memory sub-system fail bit count component used to determine when to retire a portion of memory. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a three-dimensional cross-point memory device that include a cross-point array of non-volatile memory cells. Other examples of non-volatile memory devices are described below in conjunction with FIG. 1. A non-volatile memory device, such as a three-dimensional cross-point memory device, can be a package of one or more memory components (e.g., memory dice). Each die can consist of one or more planes. Planes can be grouped into logic units. For example, a non-volatile memory device can be assembled from multiple memory dice, which can each form a constituent portion of the memory device.

During operation a memory sub-system can experience a degradation of reliability and/or performance due to the functioning of memory cells wearing out. This wearing out can be due to a high number of cycling counts (e.g., programming and erasing data into and out of the memory cells) and can also be caused or increased by changes in temperature of the cells or due to a drift time. Therefore, it can be important to monitor the overall memory sub-system and its corresponding memory cells to determine a status of the memory sub-system and when to retire or discontinue use of that memory sub-system. As an example, in response to certain retirement criteria being met the memory sub-system can be retired. However, in response to certain retirement criteria not being met, the memory sub-system can continue in operation, even if a determined retirement time period has expired. As an example, a retirement criteria can include a number of error parameter values such as a fail bit count (FBC) at a target codeword error rate (CWER) or a codeword error rate (CWER) at a target FBC. As used herein, a retirement criteria can refer to a criteria used to determine whether a memory device and/or memory sub-system is performing a threshold number of errors where the memory device and/or memory sub-system should no longer be in use and therefore retired. Each of the error parameter values can be compared to additional error parameter values. For example, a determination of a fail bit count (FBC) value at a target codeword error rate (CWER) or a CWER at a target FBC value can be performed, as will be described further below. The retirement criteria can be determined at particular retirement checkpoints that are characterized by a certain quantity of write/read cycles, and/or a quantity of program/erase cycles, for example.

Some approaches can attempt to determine when to retire a memory sub-system based on results of a read verify of a management unit (MU) and codeword (CW). As used herein, a "managed unit" (MU) generally refers to a number of memory cells that are programmed and/or read together or as a functional group. A managed unit may correspond to a logical block size (e.g., a data transfer size of a host and/or a data management size of a memory system), which can be, for example, 4 KB. As an example, a managed unit can be mapped to a physical set of memory cells. However, embodiments are not so limited. For example, a managed unit may correspond to more than a logical block size when a group of memory cells storing user data and overhead data (e.g., data informative of other data stored within the group of memory cells) corresponds to more than a logical block size. As an example, the overhead data may include data such as metadata, error correction code (ECC) data, logical block addresses (LBA) data as well as counters (e.g., read/write counters) associated with memory operations performed on a managed unit. In some embodiments, a MU can include multiple codewords. As used herein, a "codeword" generally refers to an element of an error correcting code. A codeword can, in some embodiments, be an independently encoded data set that is protected with a CRC.

In this approach of using MUs, the memory sub-system can be retired based on a retired MU listing where, when the number of retired MUs is larger than a threshold value, the memory sub-system is retired. However, this prior approach may not monitor the performance of a more large scale number of memory cells during the lifetime of operation of the memory sub-system. Therefore, retirement of the memory sub-system may be based simply on an available amount of storage space left and can therefore be oversimplified, given various stress conditions on the media of the memory sub-system.

Aspects of the present disclosure address the above and other deficiencies by analyzing various data reliability parameters associated with the memory sub-system, such as FBC and CW parameters described above, to provide real-time memory sub-system monitoring to insure data integrity. Further, in response to the retirement criteria not being met, even though a memory sub-system (or memory product) lifetime may be reached, the memory sub-system may be allowed to continue to operate, thereby furthering operation time beyond what may have otherwise been allowed in the approaches described above. In some examples, these data reliability parameters can be used to determine retirement of the memory sub-system on a component basis (e.g., die by die basis) or a broader basis (e.g., where MUs could include multiple codewords representing multiple components, such as memory dice).

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a fail bit count ("FBC") component 113. Although not shown in FIG. 1 so as to not obfuscate the drawings, the FBC component 113 can include various circuitry to facilitate monitoring error parameter values, such as a fail bit count and/or other retirement criteria for a memory sub-system and/or components of the memory sub-system, determining whether to retire a memory sub-system and/or a portion of the memory sub-system and/or components of the memory sub-system based on the error parameters values and other data reliability parameters of the memory sub-system and/or components of the memory sub-system. In some embodiments, the FBC component 113 can include a special purpose circuitry in the form of an ASIC, FPGA, state machine, and/or other logic circuitry that can allow the FBC component 113 to orchestrate and/or perform operations to selectively perform retirement criteria monitoring operations for the memory device 130 and/or the memory device 140 based on determined operating FBC values and/or codeword error rates.

In some embodiments, the memory sub-system controller 115 includes at least a portion of the FBC component 113. For example, the memory sub-system controller 115 can include a processor 117 (processing device) configured to execute instructions stored in local memory 119 for performing the operations described herein. In some embodiments, the FBC component 113 is part of the host system 110, an application, or an operating system.

In a non-limiting example, an apparatus (e.g., the computing system 100) can include a memory sub-system FBC component 113. The memory sub-system FBC component 113 can be resident on the memory sub-system 110. As used herein, the term "resident on" refers to something that is physically located on a particular component. For example, the memory sub-system FBC component 113 being "resident on" the memory sub-system 110 refers to a condition in which the hardware circuitry that includes the memory sub-system FBC component 113 is physically located on the memory sub-system 110. The term "resident on" may be used interchangeably with other terms such as "deployed on" or "located on," herein.

The memory sub-system FBC component 113 can be configured to monitor error parameter values, such as FBC values at target CWER and/or CWER at target FBC values, for memory components of the memory sub-system and determine that an error parameter value corresponding to at least one of the memory components has reached a threshold error parameter value (or exceeded a statistical boundary of the error parameter value, as will be described further below). As described above, the memory components can be memory dice or memory packages that form at least a portion of the memory device 130.

The memory sub-system FBC component 113 can be further configured to determine a comparison of an FBC value to a target codeword error rate (CWER) and/or a CWER at a target FBC value. By determining these retirement criteria, the memory sub-system FBC component 113 can determine when a memory sub-system should be retired and/or whether a memory sub-system can be allowed to continue to perform even though the memory sub-system may have performed a threshold number of cycling operations (e.g., read/write cycles, program/erase cycles, etc.) that may indicate to retire the memory sub-system.

In some embodiments, retirement of the memory sub-system can be determined, at least in part, on a predetermined relationship between an FBC value and a target CWER. Further, retirement of the memory sub-system can be determined, at least in part, on a predetermined relationship between a CWER and a target FBC value. The retirement of the memory sub-system can be based on a comparison of a current FBC value at a target CWER to the predetermined relationship between the FBC value and the target CWER. Likewise, retirement of the memory sub-system can be based on a comparison of a current CWER value at a target FBC value to the predetermined relationship between a CWER value at a target FBC value.

In another non-limiting example, a system (e.g., the computing system 100) can include a memory sub-system 110 including memory components arranged to form a stackable cross-gridded array of memory cells. A processing device (e.g., the processor 117 and/or the local media controller 135) can be coupled to the memory components and can perform operations including monitoring error parameter values (e.g., FBC values and CWER) and retirement criteria (such as relationships between the FBC values and the CWERs) for the memory components and determining that retirement criteria corresponding to at least one of the memory components has reached a threshold retirement criteria value, based on the predetermined retirement criteria values.

For example, the processing device can be configured to perform operations including performing a number of cycle operations and determining a retirement criteria value associated with each of the number of cycles. These determined (or predetermined) retirement criteria can be compared with retirement criteria values obtained during subsequent operation of the memory sub-system at each of the corresponding number of cycle operations. In this way, a threshold baseline of a standard boundary based on retirement criteria (such as FBC at a target CWER or CWER at a target FBC) can be determined prior to operation and used for comparison purposes to determine whether to retire the memory sub-system.

Figure 2A:
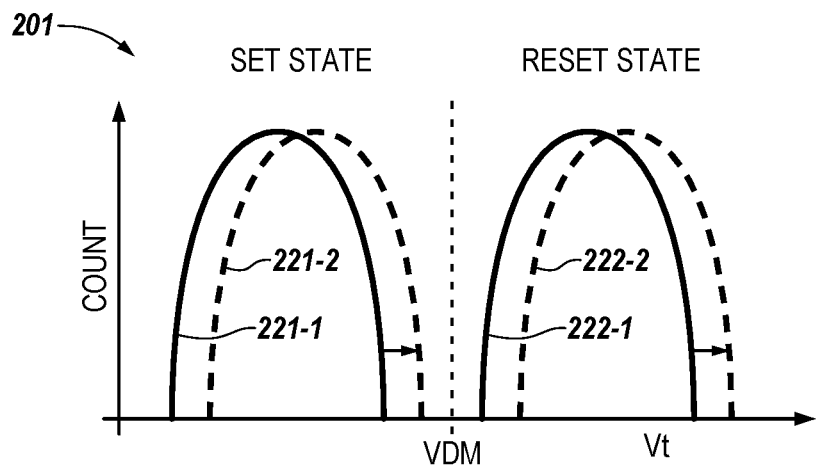
FIGS. 2A-2C each illustrate an example voltage distribution at a particular state in accordance with some embodiments of the present disclosure.
Figure 2B:
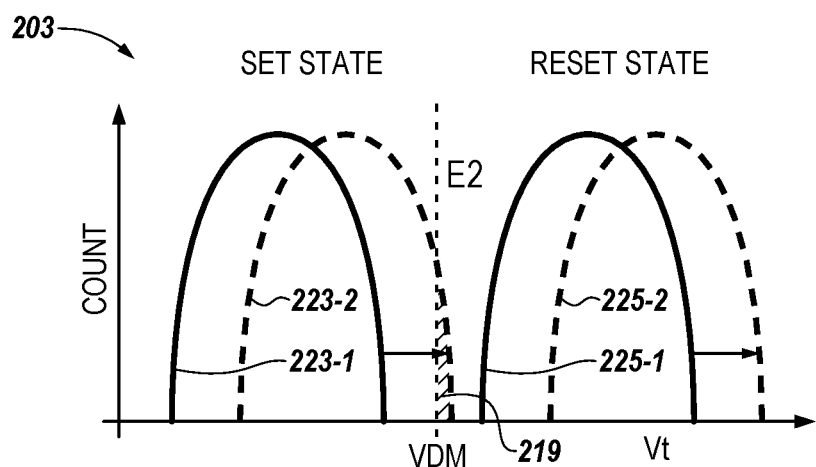
Figure 2C:
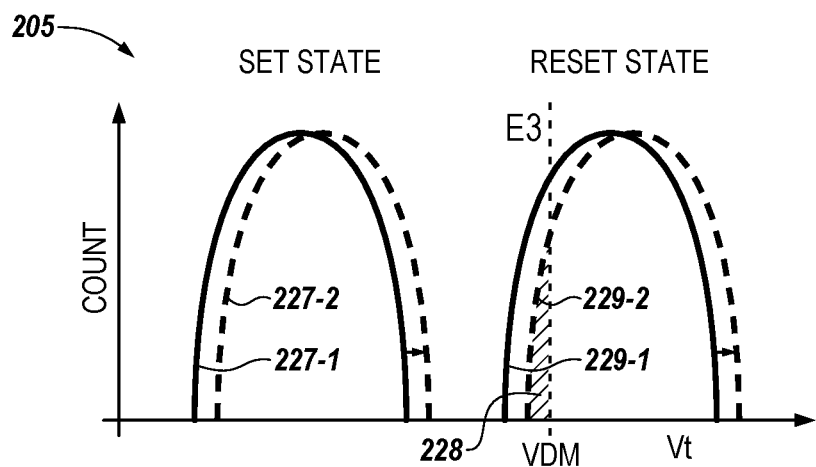

FIGS. 2A-2C each illustrate an example voltage distribution at a particular memory cell voltage state in accordance with some embodiments of the present disclosure. FIGS. 2A-2C describe how drift can result in an error of either reading a memory cell that is in a set state as if the memory cell is in the reset state and, vice versa, reading a memory cell that is in a reset state as if the memory cell is in a set state. FIG. 2A illustrates voltage distributions corresponding to an initial time t=0 and a time period after a drift of a memory cell where no error is illustrated. The voltage demarcation (VDM) is used to sense whether the memory cell is in a set state or a reset state. For example, a first voltage distribution 221-1 corresponding to a set state is represented as occurring at an initial beginning time period, t=0, and a second voltage distribution (dotted line) 221-2 corresponding to the set state is represented after a particular time period has elapsed (e.g., a drift has occurred). Further, a first voltage 222-1 corresponding to a reset state is represented as occurring at an initial time period, t=0, and a second voltage distribution 222-2 corresponding to the reset state is represented as occurring after the particular time period has occurred (e.g., the drift has occurred). As is illustrated in FIG. 2A, neither of the second voltage distributions 221-2 and 222-2 have crossed the VDM line, indicating that an error in reading the memory cell would not occur due to drift.

FIG. 2B illustrates voltage distributions corresponding to an initial time t=0 and a time period after a first voltage drift of a memory cell (referred to as an E2 error) has occurred. An E2 error can occur after a longer drift time, such as approximately 5-15 minutes, or at least greater than 10 minutes, has occurred. The voltage demarcation (VDM) is used to sense whether the memory cell is in a set state or a reset state. As is illustrated in FIG. 2B, a first voltage distribution 223-1 corresponding to a set state is represented as occurring at an initial beginning time period, t=0, and a second voltage distribution (dotted line) 223-2 corresponding to the set state is represented after a particular time period has occurred (e.g., an E2 drift time has occurred). Further, a first voltage 225-1 corresponding to a reset state is represented as occurring at an initial time period, t=0, and a second voltage distribution 225-2 corresponding to the reset state is represented as occurring after the particular time period has occurred (e.g., the E2 drift time has occurred). As is illustrated in FIG. 2B, the second voltage distribution 223-2 has crossed the VDM line (overlap indicated by cross hashes), indicating that a drift error (e.g., an E2 error) in reading the memory cell would occur. For example, the memory cell intended to be read in the set state may be mistakenly read as in the reset state.

FIG. 2C illustrates voltage distributions corresponding to an initial time t=0 and a time period after a second drift of a memory cell (referred to as an E3 error) has occurred. An E3 error can occur after a shorter drift time, such as approximately several microseconds, or at least less than several microseconds, has occurred. The voltage demarcation (VDM) is used to sense whether the memory cell is in a set state or a reset state. As is illustrated in FIG. 2C, a first voltage distribution 227-1 corresponding to a set state is represented as occurring at an initial beginning time period, t=0, and a second voltage distribution (dotted line) 227-2 corresponding to the set state is represented after a particular time period has occurred (e.g., an E3 drift time has occurred). Further, a first voltage 229-1 corresponding to a reset state is represented as occurring at an initial time period, t=0, and a second voltage distribution 229-2 corresponding to the reset state is represented as occurring after the particular time period has occurred (e.g., the E3 drift time has occurred). As is illustrated in FIG. 2C, the second voltage distribution 229-2 has crossed the VDM line (overlap indicated by cross hashes), indicating that a drift error (e.g., an E3 error) in reading the memory cell would occur. For example, the memory cell intended to be read in the reset state may be mistakenly read as in the set state.

These errors due to the two drifts time (e.g., E2 and E3 drift times) can result after a number of cycling operations have occurred. In order to prevent such errors from affecting performance of the memory sub-system, both such errors need to be monitored and the memory sub-system retired once at least one of the errors reach a threshold that indicates to retire the memory sub-system.

Figure 3A:
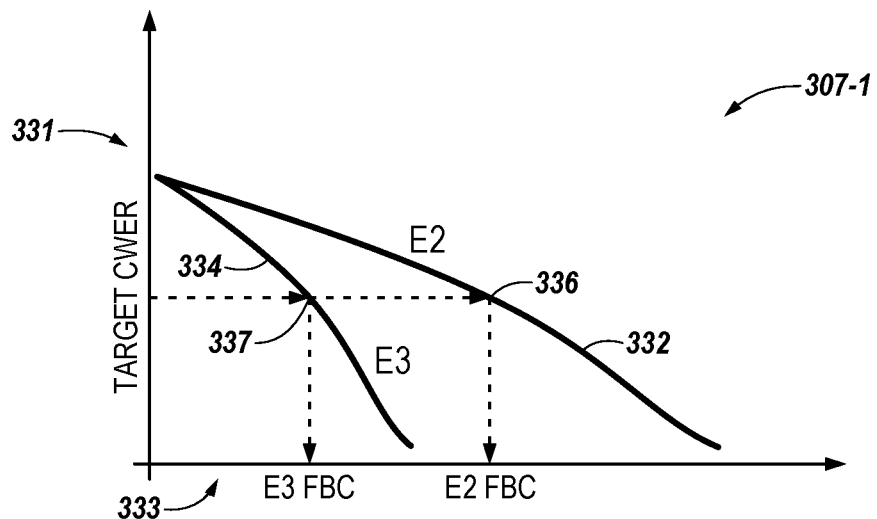
FIG. 3A illustrates an example survival probability distribution using target codeword error rates for codewords in accordance with some embodiments of the present disclosure.

FIG. 3A illustrates an example survival probability distribution 307-1 using target codeword error rates (CWER) for codewords in accordance with some embodiments of the present disclosure. The survival probability distribution 307-1 indicates how many codewords are remaining for a particular memory sub-system that have fewer than the corresponding number of fail bit counts. As an example, if an FBC value 333 of 5 corresponds to a target CWER value 331 of 0.5, the survival probability distribution 307-1 indicates that 50% of the codewords remaining have a FBC value greater than 5. The survival probability distribution 307-1 can be obtained by performing a codeword scan for a number of drift times. In one example, the codeword scan can be for a particular component (e.g., a particular drive of a memory sub-system) and the scan can indicate how many failed bits (the FBC value) each codeword of the component includes. From this data, at a target codeword error rate (CWER) 331, a corresponding fail bit count (FBC) 333 can be determined for an associated drift time. In this example, the survival probability distribution 307-1 is performed at a particular number of write cycles. For example, the survival probability distribution 307-1 may be determined at 1k write cycles but can be determined at any number of write cycles.

In one embodiment, as an example, a first drift time (e.g., a shorter drift time (such as 5-15 microseconds, 5 microseconds, 10 microseconds, 15 microseconds, etc.), which is associated with an E3 error) can be used to determine a corresponding FBC 333 at a target CWER 331. The target CWER 331 can be correlated to a specific FBC 333 at a point 337. As each of the correlations between the target CWER 331 and the corresponding FBC 333 for the first drift time are determined, an E3 survival plot line 334 can be generated.

Likewise, as an example, a second drift time (e.g., a longer drift time, such as 5-15 minutes, 5 minutes, 10 minutes, 15 minutes) which is associated with an E2 error) can be used for determining a corresponding FBC 333 at a target CWER 331. The target CWER 331 can be correlated to a specific FBC 333 at a point 336. As each of the correlations between the target CWER 331 and the corresponding FBC 333 for the second drift time are determined, an E2 survival plot line 332 can be generated. The survival probability distribution 307-1 is illustrated to represent one component and one of these distributions would correspond to each component. The aggregated survival probability distributions for components is illustrated and described in associated with FIG. 3B.

Figure 3B:
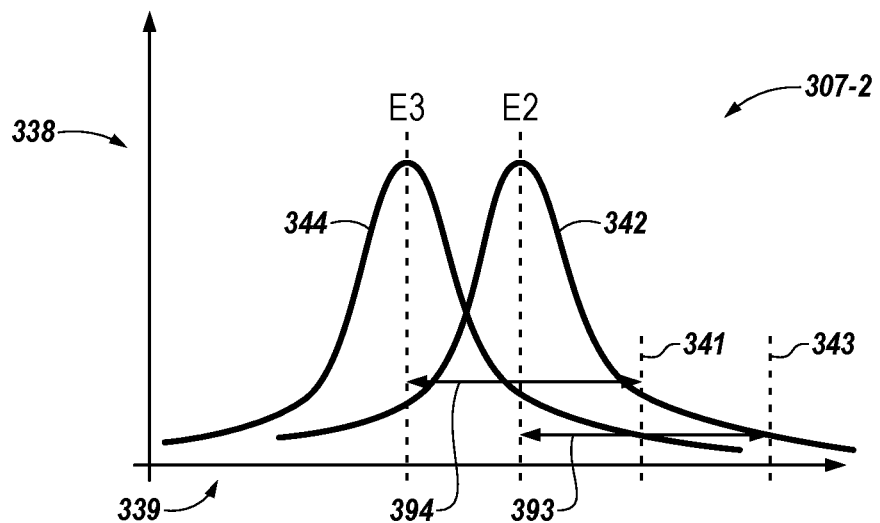
FIG. 3B illustrates an example probability density distribution for codewords using target codeword error rates in accordance with some embodiments of the present disclosure.

FIG. 3B illustrates an example probability density distribution 307-2 for codewords using target codeword error rates in accordance with some embodiments of the present disclosure. The probability density distribution 307-2 is a plot of the data from each of the components (of which each of the components would be plotted, as is illustrated in FIG. 3A) showing the probability density 338 (or distribution) of FBC values at a target CWER 339 corresponding to each component. These distributions are calculated for a number of drift times. For example, a distribution is determined illustrating a plot line 344 corresponding to a first drift time (e.g., a drift time corresponding to an E3 fail bit count) and a distribution is determined illustrating a plot line 342 corresponding to a second drift time (e.g., a drift time corresponding to an E2 fail bit count).

Figure 3C:
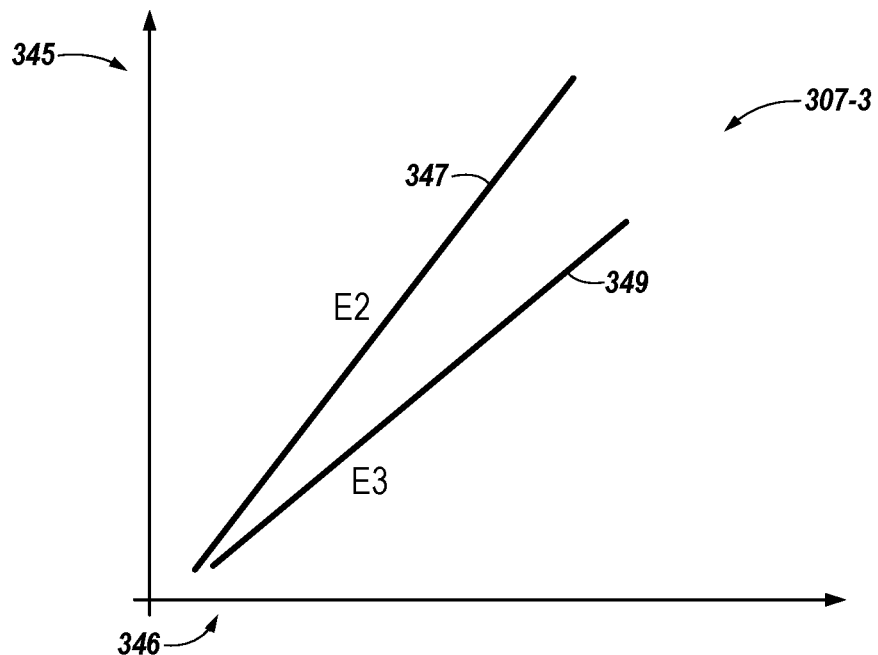
FIG. 3C illustrates an example distribution related to a relationship between a number of write cycles and a 3-sigma boundary in accordance with some embodiments of the present disclosure.

In at least one embodiment, a 3-sigma boundary is determined for each of the plot lines 344 and 342. For example, a first 3-sigma standard deviation 394 is determined for the plot line 344 that corresponds to the first drift time (E3) and from this a 3-sigma boundary 341 is determined. Likewise, a second 3-sigma standard deviation 393 is determined for the plot line 342 that corresponds to the second drift time (E2) and from this a 3-sigma boundary 343 is determined. These 3-sigma boundaries 341, 343 are used in subsequent operations, as illustrated in FIG. 3C to determine at retirement checkpoints whether a memory sub-system should be retired. In this example, the 3-sigma boundaries 341, 343 (referred to herein as statistical boundaries) are determined for a particular number of write cycles. For example, the 3-sigma boundaries 341, 343 may be determined at 1k write cycles but can be determined at any number of write cycles.

FIG. 3C illustrates an example distribution 307-3 related to a relationship between a number of write cycles and a 3-sigma boundary in accordance with some embodiments of the present disclosure. As FIG. 3A determined a survival probability corresponding to each component and FIG. 3B determined a probability density that combined the data illustrated in FIG. 3A for more than one component, FIG. 3C is determining the data illustrated in FIG. 3B at multiple write cycles in order to determine the relationship between a number of write cycles and the 3-sigma boundary (described in association with FIG. 3B) corresponding to more than one drift time.

As illustrated in FIG. 3C, at each of a number of write cycles 346, a corresponding 3-sigma boundary 345 for each of a first drift (E3) and a second drift (E2) is determined. For example, an E3 3-sigma plot line 349 illustrates as the number of write cycles 346 increases, the 3-sigma boundary 345 increases. Likewise, an E2 2-sigma plot line 347 illustrates that as the number of write cycles 346 increases, the 3-sigma boundary 345 increases. However, the E3 3-sigma plot line 349 has a greater number of write cycles than the E2 3-sigma plot line 347 before it correlates to a similar 3-sigma boundary 345. This relationship between the 3-sigma boundaries and the number of write cycles can be used during subsequent retirement checkpoints to determine whether to retire a memory sub-system, as will be described in association with FIG. 3D. A retirement checkpoint refers to a checkpoint at a number of write cycles where a retirement determination is performed. As an example, a retirement determination can be performed at a checkpoint of 10k write cycles, 50k write cycles, 100k write cycles, 200k write cycles, 300k write cycles, etc.

Figure 3D:
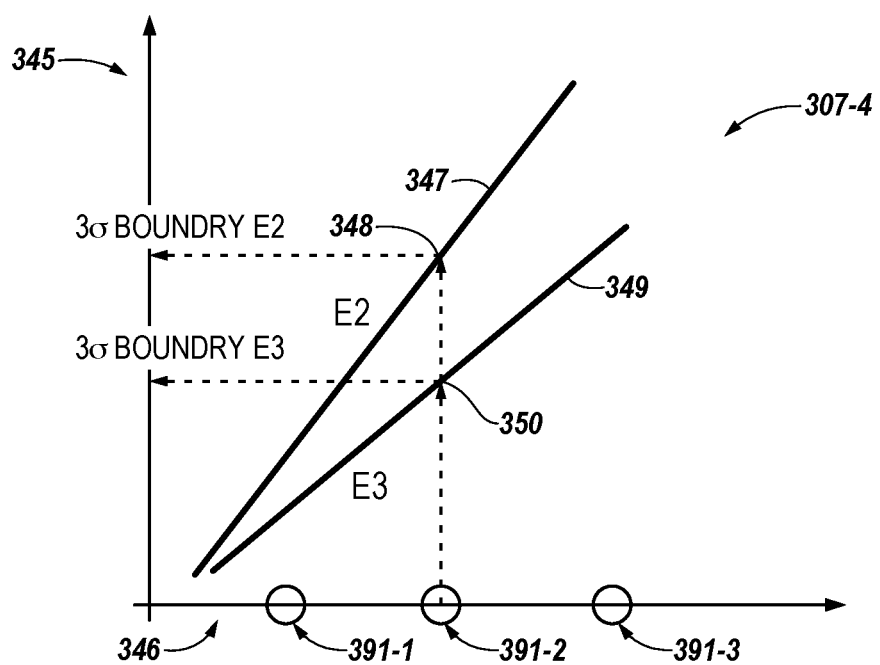
FIG. 3D illustrates an example distribution for performing a retirement determination in accordance with some embodiments of the present disclosure.

FIG. 3D illustrates an example distribution 307-4 for performing a retirement determination in accordance with some embodiments of the present disclosure. The distribution 307-4 is used to compare data compiled during operation of the memory sub-system to the data predetermined as a threshold, such as the 3-sigma boundaries illustrated in and described in association with FIG. 3C. A number of retirement checkpoints 391-1, 391-2, 391-3 can be used to indicate to perform a retirement determination which compares the real-time error parameter value (e.g., the FBC per codeword at the corresponding target CWER), illustrated in FIG. 3D to a predetermined threshold 3-sigma boundary in order to determine whether to retirement the memory sub-system. As an example, a retirement checkpoint 391-2 can be at 1k write cycles.

In response to the memory sub-system reaching the 1k write cycle point, a retirement determination can be performed by determining a real-time error parameter value, e.g., the FBC per codeword at the corresponding target CWER, for at least two drift times (e.g., drift time associated with an E3 FBC and a drift time associated with an E2 FBC) for a particular component, as is described in association with FIG. 3A. The real-time error parameter value is compared to the predetermined threshold 3-sigma boundary corresponding to the 1k write cycle point. In response to the real-time error parameter value being greater than the 3-sigma boundary at the corresponding checkpoint location, the memory component can be retired.

As illustrated in FIG. 3D, at the retirement checkpoint 391-2 (which for the purposes of this example has been designated as occurring at 1k write cycles), a 3-sigma boundary 345 for each of a first drift (E3) and a second drift (E2) is used (which was determined and described in association with FIG. 3C). For example, an E3 3-sigma plot line 349 includes a point 350 (at checkpoint 391-2) that correlates to a particular 3-sigma boundary (horizontal dotted line from point 350) and to a particular number of write cycles (shown by vertical dotted line illustrated at checkpoint 391-2, which will be described further below). Further, an E2 3-sigma plot line 347 includes a point 348 that correlates to a particular 3-sigma boundary (horizontal dotted line from point 348) and to a particular number of write cycles (shown by vertical dotted line illustrated at checkpoint 391-2).

This relationship between the determined real-time error parameter value and the number of write cycles can be used to compare to the predetermined 3-sigma boundary threshold for the number of write cycles that corresponds to the retirement checkpoint. For example, the real-time error parameter value (corresponding to E2) can be compared to the 3-sigma boundary illustrated in FIG. 3D that also corresponds to the same number of write cycles (e.g., 1k write cycles in this example). If the determined FBC value at the target CWER for this component at the 1k write cycle point (which is the retirement checkpoint) is greater than the corresponding 3-sigma boundary (e.g., the boundary illustrated in FIG. 3C), then the component is retired or reported for further testing. If the determined FBC value at the target CWER is less than the corresponding 3-sigma boundary, then the component (and/or the memory sub-system) passes the retirement checkpoint and is allowed to continue operating.

Figure 4A:
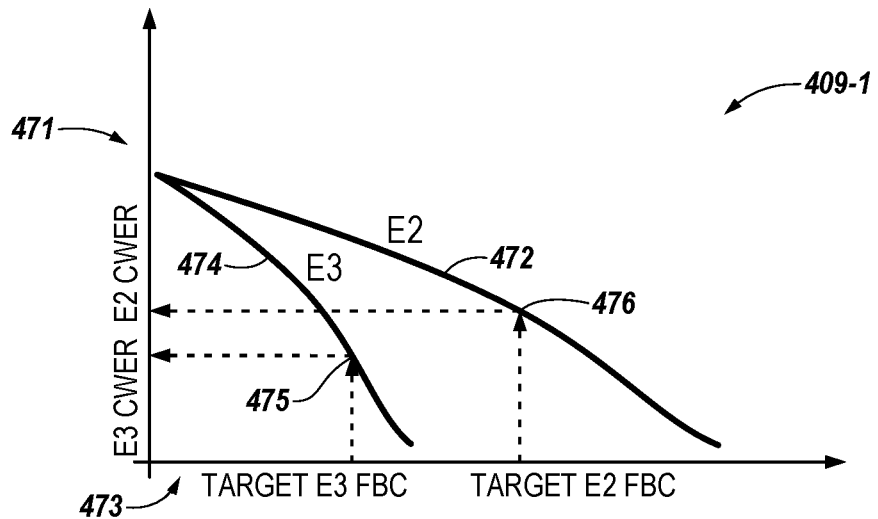
FIG. 4A illustrates an example survival probability distribution using target fail bit counts for codewords in accordance with some embodiments of the present disclosure.

FIG. 4A illustrates an example survival probability distribution 409-1 using target fail bit counts for codewords in accordance with some embodiments of the present disclosure. The survival probability distribution 409-1 indicates how many codewords are remaining for a particular memory sub-system that have fewer than the corresponding number of fail bit counts. As an example, if an FBC value 473 of 5 corresponds to a target CWER value 471 of 0.5, the survival probability distribution 409-1 indicates that 50% of the codewords remaining have a FBC value greater than 5. The survival probability distribution 409-1 can be obtained by performing a codeword scan for a number of drift times. In one example, the codeword scan can be for a particular component (e.g., a particular drive of a memory sub-system) and the scan can indicate how many failed bits (the FBC value) each codeword of the component includes. From this data, at a target FBC 473, a corresponding codeword error rate (CWER) 471 can be determined for an associated drift time. In this example, the survival probability distribution 409-1 is determined at a particular number of write cycles. For example, the survival probability distribution 409-1 may be determined at 1k write cycles but can be determined at any number of write cycles.

In at least one embodiment, as an example, a first drift time (e.g., a shorter drift time (such as 5-15 microseconds, 5 microseconds, 10 microseconds, 15 microseconds), which is associated with an E3 error) can be used to determine a corresponding CWER 471 at a target FBC 473. The target FBC 473 can be correlated to a specific CWER 471 at a point 475. As each of the correlations between the target FBC 473 and the corresponding CWER 471 for the first drift time are determined, an E3 survival plot line 474 can be generated.

Likewise, as an example, a second drift time (e.g., a longer drift time, such as 5-15 minutes, 5 minutes, 10 minutes, 15 minutes), which is associated with an E2 error can be used for determining a corresponding CWER 471 at a target FBC 473. The target FBC 473 can be correlated to a specific CWER 471 at a point 476. As each of the correlations between the target FBC 473 and the corresponding CWER 471 for the second drift time are determined, an E2 survival plot line 472 can be generated. The survival probability distribution 409-1 is illustrated to represent one component and one of these distributions would correspond to each component. The aggregated survival probability distributions for components is illustrated and described in associated with FIG. 4B.

Figure 4B:
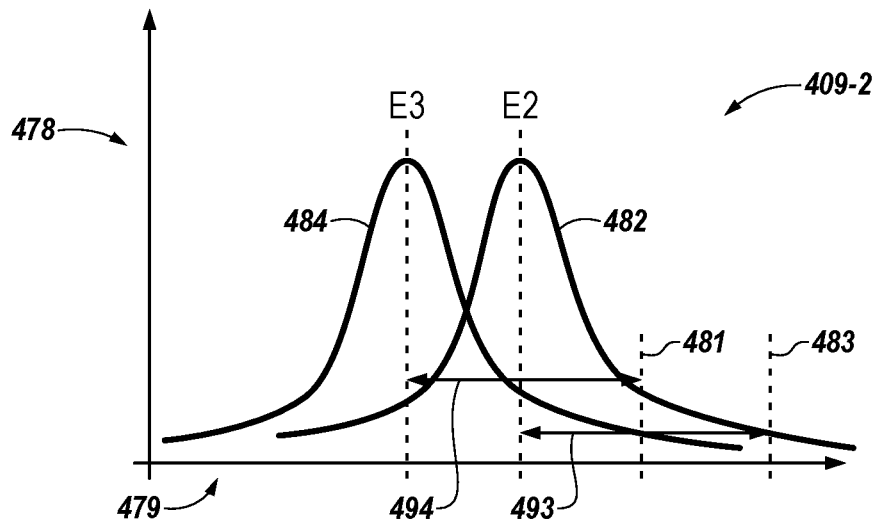
FIG. 4B illustrates an example probability density distribution for codewords using target fail bit counts in accordance with some embodiments of the present disclosure.

FIG. 4B illustrates an example probability density distribution 409-2 for codewords using target fail bit counts in accordance with some embodiments of the present disclosure. The probability density distribution 409-2 is a plot of the data from each of the components (of which each of the components would be plotted, as is illustrated in FIG. 4A) showing the probability density 478 (or distribution) of CWER at target FBC values 479 corresponding to each component. These distributions are calculated for a number of drift times. For example, a distribution is determined illustrating a plot line 484 corresponding to a first drift time (e.g., a drift time corresponding to an E3 fail bit count) and a distribution is determined illustrating a plot line 482 corresponding to a second drift time (e.g., a drift time corresponding to an E2 fail bit count).

Figure 4C:
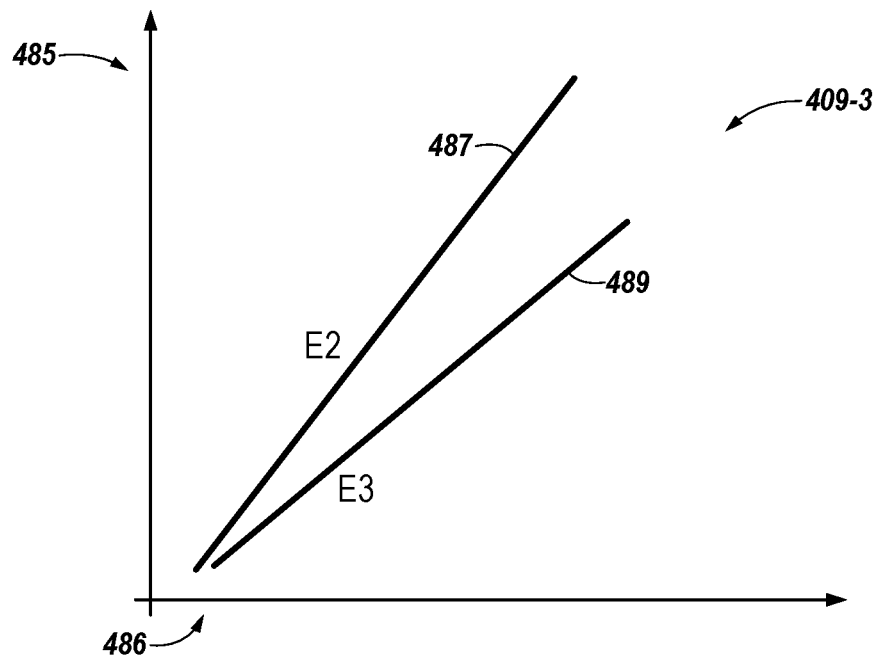
FIG. 4C illustrates an example distribution related to a relationship between a number of write cycles and a 3-sigma boundary in accordance with some embodiments of the present disclosure.

In one embodiment, a 3-sigma boundary is determined for each of the plot lines 484 and 482. For example, a first 3-sigma standard deviation 494 is determined for the plot line 484 that corresponds to the first drift time (E3) and from this a 3-sigma boundary 481 is determined. Likewise, a second 3-sigma standard deviation 493 is determined for the plot line 482 that corresponds to the second drift time (E2) and from this a 3-sigma boundary 483 is determined. These 3-sigma boundaries 481, 483 are used in subsequent operations, as illustrated in FIG. 4C to determine at retirement checkpoints whether a memory sub-system should be retired. In this example, the 3-sigma boundaries 481, 483 are determined for a particular number of write cycles. For example, the 3-sigma boundaries 481, 483 may be determined at 1k write cycles but can be determined at any number of write cycles.

FIG. 4C illustrates an example distribution 409-3 related to a relationship between a number of write cycles and a 3-sigma boundary in accordance with some embodiments of the present disclosure. As FIG. 4A determined a survival probability corresponding to each component and FIG. 4B determined a probability density that combined the data illustrated in FIG. 4A for more than one component, FIG. 4C is determining the data illustrated in FIG. 4B at multiple write cycles in order to determine the relationship between a number of write cycles and the 3-sigma boundary (described in association with FIG. 4B) corresponding to more than one drift time.

As illustrated in FIG. 4C, at each of a number of write cycles 486, a corresponding 3-sigma boundary 485 for each of a first drift (E3) and a second drift (E2) is determined. For example, an E3 3-sigma plot line 489 illustrates as the number of write cycles 486 increases, the 3-sigma boundary 485 increases. Likewise, an E2 3-sigma plot line 487 illustrates that as the number of write cycles 486 increases, the 3-sigma boundary 485 increases. However, the E3 3-sigma plot line 489 has a greater number of write cycles than the E2 3-sigma plot line 487 before it correlates to a similar 3-sigma boundary 485. This relationship between the 3-sigma boundaries and the number of write cycles can be used during subsequent retirement checkpoints to determine whether to retire a memory sub-system, as will be described in association with FIG. 4D. A retirement checkpoint refers to a checkpoint at a number of write cycles where a retirement determination is performed. As an example, a retirement determination can be performed at a checkpoint of 10k write cycles, 50k write cycles, 100k write cycles, 200k write cycles, 300k write cycles, etc.

Figure 4D:
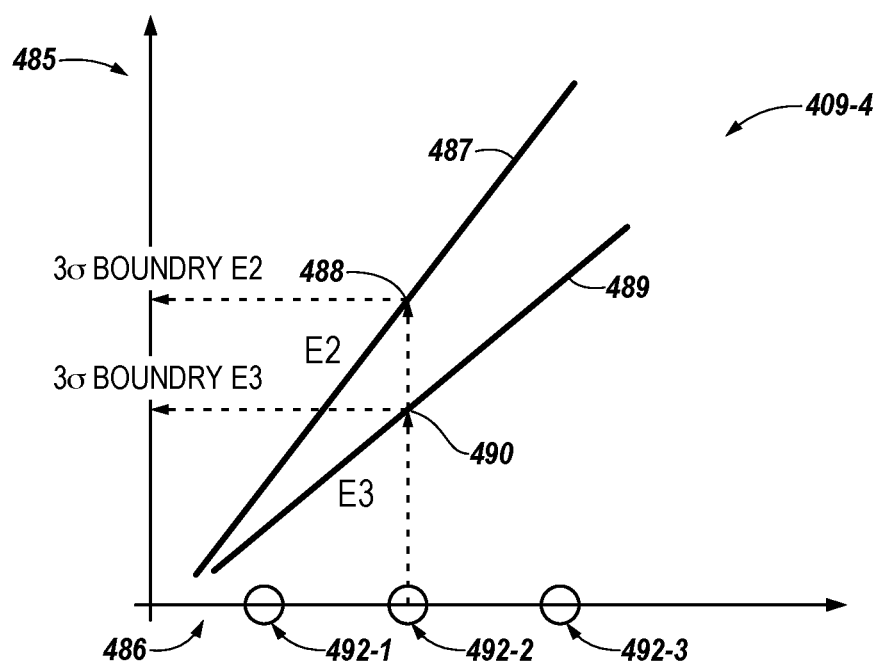
FIG. 4D illustrates an example distribution for performing a retirement determination in accordance with some embodiments of the present disclosure.

FIG. 4D illustrates an example distribution 409-4 for performing a retirement determination in accordance with some embodiments of the present disclosure. The distribution 409-4 is used to compare data compiled during operation of the memory sub-system to the data predetermined as a threshold, such as the 3-sigma boundaries illustrated in and described in association with FIG. 4C. A number of retirement checkpoints 492-1, 492-2, 493-3 can be used to indicate to perform a retirement determination which compares the real-time error parameter value (e.g., the CWER at the corresponding target FBC), illustrated in FIG. 4D to a predetermined threshold 3-sigma boundary in order to determine whether to retirement the memory sub-system. As an example, a retirement checkpoint 492-2 can be at 1k write cycles.

In response to the memory sub-system reaching the 1k write cycle point, a retirement determination can be performed by determining a real-time error parameter value, e.g., the CWER at the corresponding target CWER, for at least two drift times (e.g., drift time associated with an E3 FBC and a drift time associated with an E2 FBC) for a particular component, as is described in association with FIG. 4A. The real-time error parameter value is compared to the predetermined threshold 3-sigma boundary corresponding to the 1k write cycle point. In response to the real-time error parameter value being greater than the 3-sigma boundary at the corresponding checkpoint location, the memory component can be retired.

As illustrated in FIG. 4D, at the retirement checkpoint 492-2 (which for the purposes of this example has been designated as occurring at 1k write cycles), a 3-sigma boundary 485 for each of a first drift (E3) and a second drift (E2) is used (which was determined and described in association with FIG. 4C). For example, an E3 3-sigma plot line 489 includes a point 490 (at checkpoint 492-2) that correlates to a particular 3-sigma boundary (horizontal dotted line from point 490) and to a particular number of write cycles (shown by vertical dotted line illustrated at checkpoint 492-2, which will be described further below). Further, an E2 3-sigma plot line 487 includes a point 488 that correlates to a particular 3-sigma boundary (horizontal dotted line from point 488) and to a particular number of write cycles (shown by vertical dotted line illustrated at checkpoint 492-2).

This relationship between the determined real-time error parameter value and the number of write cycles can be used to compare to the predetermined 3-sigma boundary threshold for the number of write cycles that corresponds to the retirement checkpoint. For example, real-time error parameter value (corresponding to E2) can be compared to the 3-sigma boundary illustrated in FIG. 4C that also corresponds to the same number of write cycles (e.g., 1k write cycles in this example). If the determined CWER at the target FBC for this component at the 1k write cycle point (which is the retirement checkpoint) is greater than the corresponding 3-sigma boundary (e.g., the boundary illustrated in FIG. 4C), then the component is retired or reported for further testing. If the determined CWER at the target FBC is less than the corresponding 3-sigma boundary, then the component (and/or the memory sub-system) passes the retirement checkpoint and is allowed to continue operating.

Figure 5:
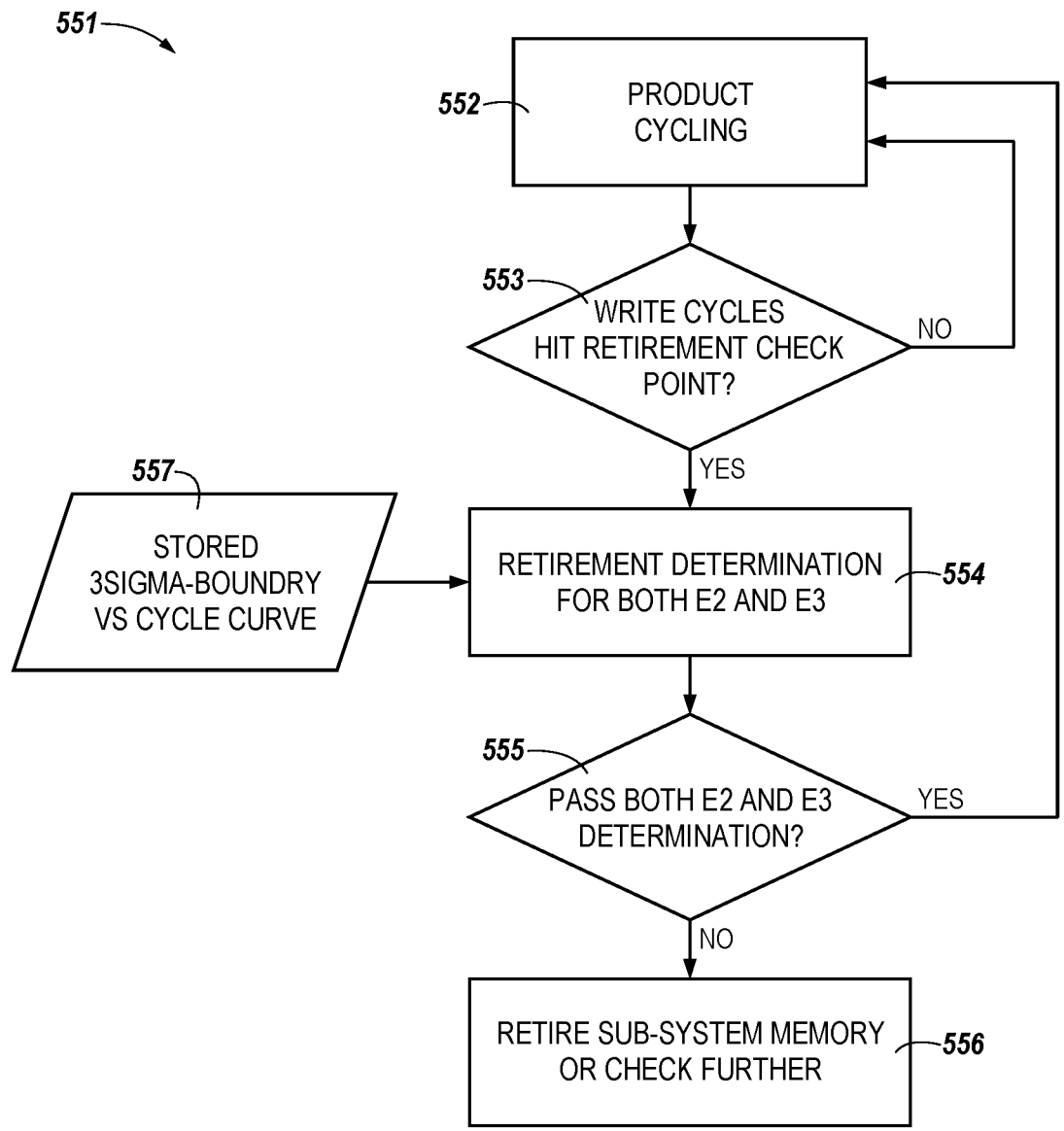
FIG. 5 is a flow diagram corresponding to memory sub-system failed bit count distribution in accordance with some embodiments of the present disclosure.

FIG. 5 is a flow diagram 551 corresponding to memory sub-system retirement determination in accordance with some embodiments of the present disclosure. The flow diagram 551 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow diagram 551 is performed by the FBC component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 552, the memory sub-system can be performing write cycles ("product cycling"). At block 553, a determination of whether the number of write cycles has hit a retirement checkpoint can be performed. In response to the number of write cycles not hitting the retirement checkpoint ("NO"), the performance of write cycles can continue. In response to the number of write cycles hitting the retirement checkpoint ("YES"), at 554, a retirement determination for both E2 and E3 drift times can be performed. At block 557, stored 3-sigma boundary vs cycle curve data can be input into the retirement determination. As an example, a comparison of FBC values at corresponding CWERs to predetermined 3-sigma boundary thresholds corresponding to the particular write cycle number can be performed, as is illustrated and described in association with FIGS. 3D and 4D.

At block 555, a determination of whether both E2 and E3 has passed the retirement determination can be performed. In response to both E2 and E3 passing the retirement determination ("YES"), the memory sub-system can continue to perform write cycles. In response to either of E2 or E3 not passing the retirement determination ("NO"), the memory sub-system, or a portion of the memory sub-system not passing the retirement determination, can be retired or a further check can be performed on the particular component or multiple components.

In some examples, the comparison of the FBC values at a particular CWER to a predetermined threshold 3-sigma deviation can be used in conjunction with methods for retirement including MUs. As an example, the above described approach can be used in conjunction with an approach that includes determining of a number of MUs are above a threshold related to retirement, then the memory sub-system can be retired. Further, the MU can use multiple codewords across multiple die where each codeword represents 1 die or the MU could be multiple codewords representing multiple die where a single codeword represents more than one die or at least portions of more than one die, or a combination of different codewords from different components (e.g., memory dice) could be used. Further, the approach described herein can be used for a specific component (such as a memory die), multiple components, or for a broader memory system.

Figure 6:
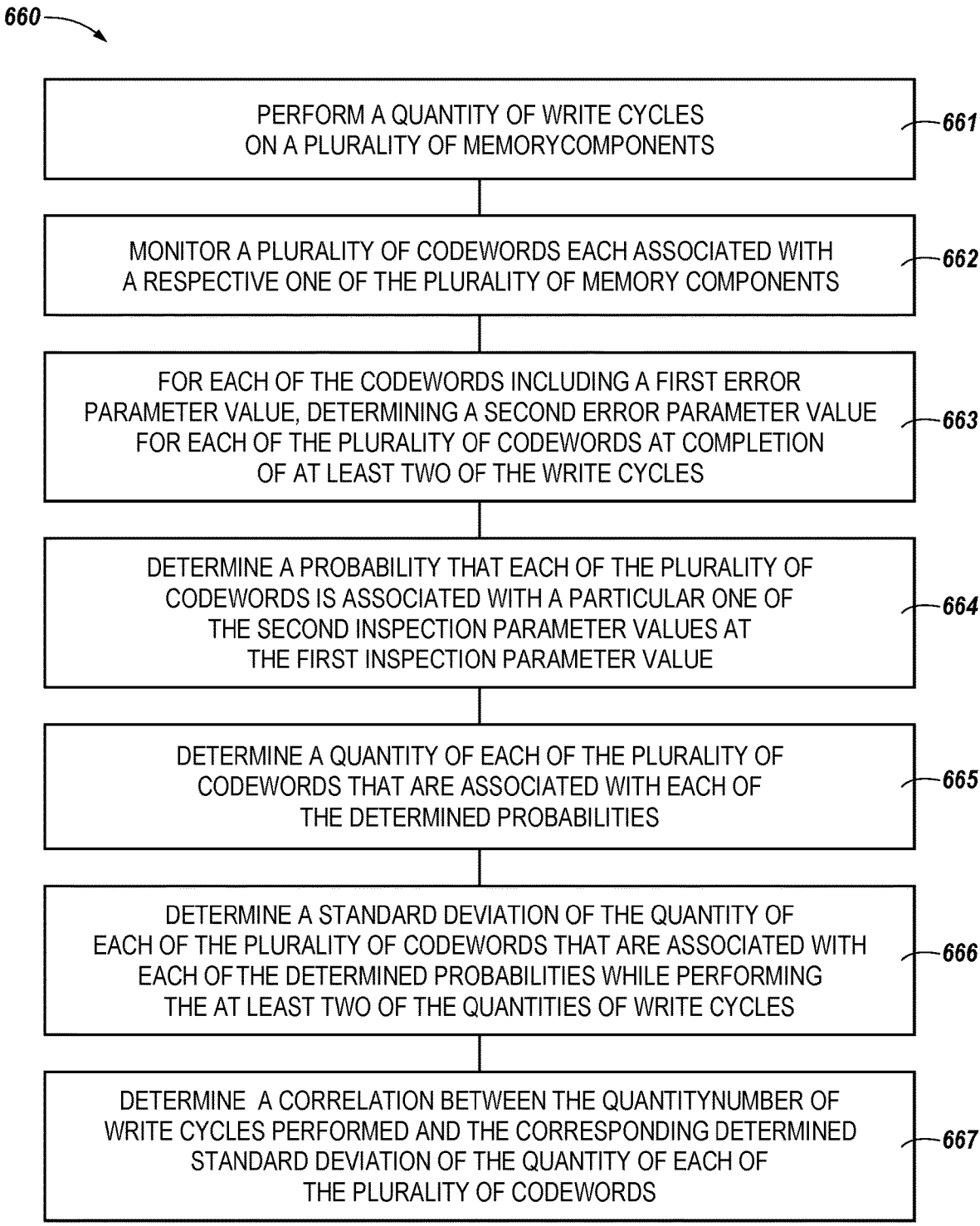
FIG. 6 is a flow diagram corresponding to a method for memory sub-system retirement determination in accordance with some embodiments of the present disclosure.

FIG. 6 is flow diagram corresponding to a method 660 for a memory sub-system retirement determination in accordance with some embodiments of the present disclosure. The method 660 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 660 is performed by the FBC component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 661, the method 660 can include performing a quantity of write cycles on memory components. At block 662, the method 660 can include monitoring codewords each associated with a respective one of the memory components. At block 663, the method 660 can include, for each of the codewords including a first error parameter value, determining a second error parameter value for each of the codewords at completion of at least two of the write cycles. In one example, the first error parameter value or the second error parameter value is a target codeword error rate or a fail bit count and the other of the first error parameter and the second error parameter value is the other of the target codeword error rate or the fail bit count. In one example, the determination of the second error parameter value for each of the codewords is performed on each of the codewords associated with a drift time period. In one example, the determination of the second error parameter value for each of the codewords is performed on each of the codewords associated with an additional drift time period greater than the drift time period At block 664, the method 660 can include determining a probability that each of the codewords is associated with a particular one of the second error parameter values at the first error parameter value. At block 665, the method 660 can include determining a quantity of each of the codewords that are associated with each of the determined probabilities. At block 666, the method 660 can include determining a statistical boundary (e.g., standard deviation) of the quantity of each of the codewords that are associated with each of the determined probabilities while performing the at least two of the quantities of write cycles. In terms of statistics, a statistical boundary can be equal to a mean value+ k*standard deviation, k=1, 2, 3, . . . . While with a single standard deviation k=1, examples are not so limited and can be adjusted based on criteria.

At block 667, the method 660 can include determining a correlation between the quantity of write cycles performed and the corresponding determined statistical boundary of the quantity of each of the codewords. In one example, the method 660 further including, at one of the quantities of write cycles performed on one of the memory components, determining a real-time error parameter value associated with the one of the memory components, and comparing the determined real-time error parameter value associated with the one of the memory components to the determined correlation between the quantity of write cycles performed and the corresponding determined statistical boundary of the quantity of each of the codewords corresponding to each of the memory components.

In one example, the method 660 further including comparing a error parameter value associated with a drift time of the one of the memory components to the determined correlation between the quantity of write cycles performed and the corresponding determined statistical boundary of the quantity of each of the codewords that is also associated with the drift time. The method 660 further including comparing a error parameter value associated with an additional drift time shorter than the drift time of the one of the memory components to the determined correlation between the quantity of write cycles performed and the corresponding determined statistical boundary of the quantity of each of the codewords that is also associated with the additional drift time.

Figure 7:
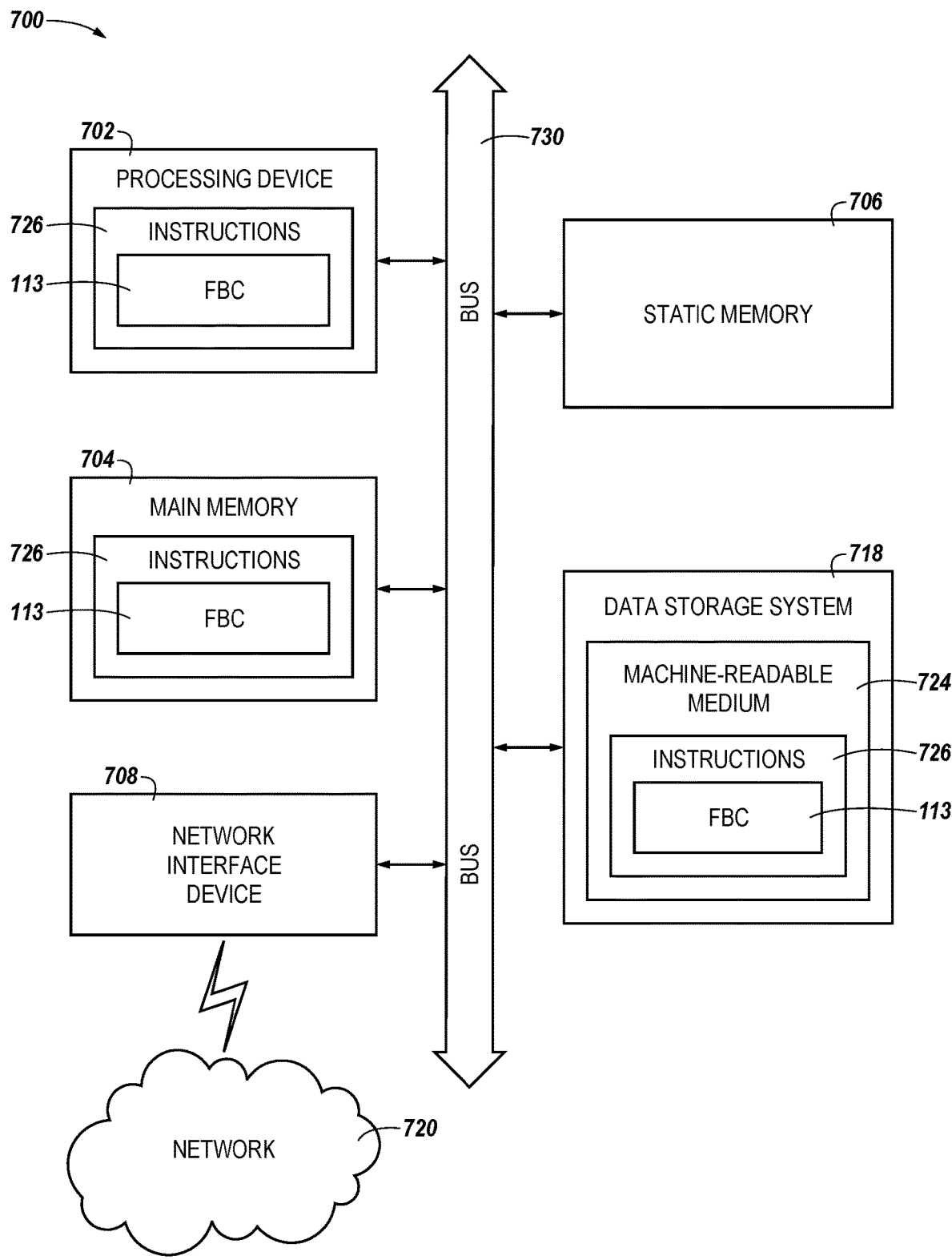
FIG. 7 is a block diagram of an example computer system in which embodiments of the present disclosure may operate.

FIG. 7 is a block diagram of an example computer system 700 in which embodiments of the present disclosure may operate. For example, FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the FBC component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a FBC component (e.g., the FBC component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclo-

What is claimed is:

1. A method, comprising:
performing a quantity of write cycles on a plurality of memory components;
monitoring a plurality of codewords each associated with a respective one of the plurality of memory components;
for each of the codewords including a first error parameter value, determining a second error parameter value for each of the plurality of codewords at completion of at least two of the write cycles;
determining a probability that each of the plurality of codewords is associated with a particular one of the second error parameter values at the first error parameter value;
determining a quantity of each of the plurality of codewords that are associated with each of the determined probabilities;
determining a statistical boundary of the quantity of each of the plurality of codewords that are associated with each of the determined probabilities while performing the at least two of the quantities of write cycles; and
determining a correlation between the quantity of write cycles performed and the corresponding determined statistical boundary of the quantity of each of the plurality of codewords.

2. The method of claim 1, wherein the first error parameter value or the second error parameter value is a target codeword error rate or a fail bit count and the other of the first error parameter and the second error parameter value is the other of the target codeword error rate or the fail bit count.

3. The method of claim 1, wherein the determination of the second error parameter value for each of the plurality of codewords is performed on each of the plurality of codewords associated with a drift time period.

4. The method of claim 3, wherein the determination of the second error parameter value for each of the plurality of codewords is performed on each of the plurality of codewords associated with an additional drift time period greater than the drift time period.

5. The method of claim 1, further comprising, at one of the quantities of write cycles performed on one of the memory components:
determining a real-time error parameter value associated with the one of the memory components at a particular write cycle; and
comparing the determined real-time error parameter value associated with the one of the memory components to the determined correlation between the quantity of write cycles performed and the corresponding determined statistical boundary of the quantity of each of the plurality of codewords corresponding to each of the plurality of memory components.

6. The method of claim 5, wherein the real-time error parameter value associated with a drift time of the one of the memory components is compared to the determined correlation between the quantity of write cycles performed and the corresponding determined statistical boundary of the quantity of each of the plurality of codewords that is also associated with the drift time.

7. The method of claim 6, wherein a real-time error parameter value associated with an additional drift time shorter than the drift time of the one of the memory components is compared to the determined correlation between the quantity write cycles performed and the corresponding determined statistical boundary of the quantity of each of the plurality of codewords that is also associated with the additional drift time.

8. An apparatus, comprising:
a memory device; and
a processing device coupled to the memory device and configured to:
perform a particular quantity of write cycles on data in a memory die;
determine a first statistical boundary value associated with a plurality of fail bit count values determined at a target codeword error rate of the memory die that is associated with an error having a first drift time associated therewith;
determine a second statistical boundary value associated with a plurality of fail bit count values determined at a target codeword error rate of a memory die that is associated with an error having a second drift time associated therewith; and
compare:
the first statistical boundary value with a first error parameter value corresponding to a particular quantity of write cycles and to the first drift time; and
the second statistical boundary value with a second error parameter value corresponding to the particular quantity of write cycles and to the second drift time.

9. The apparatus of claim 8, wherein the first drift time is greater than the second drift time.

10. The apparatus of claim 8, wherein the processing device is further configured to, in response to the first error parameter value being greater than the first statistical boundary value, retire the memory die.

11. The apparatus of claim 8, wherein the processing device is further configured to, in response to the second error parameter value being greater than the second statistical boundary value, retire the memory die.

12. The apparatus of claim 8, wherein the processing device is further configured to, in response to the first and the second parameter values both being less than the respective first and second statistical boundary values, assert signaling to cause memory cycles to be performed on the memory die.

13. The apparatus of claim 8, wherein the processing device is further configured to determine the first error parameter value in response to completion of performance of the particular quantity of write cycles.

14. The apparatus of claim 8, wherein the processing device is further configured to determine the second error parameter value in response to completion of performance of the particular quantity of write cycles.

15. The apparatus of claim 8, wherein the processing device is further configured to:
determine the first and the second respective statistical boundary values by:
performing a quantity of write cycles on a plurality of memory dies;
monitoring a plurality of codewords each associated with a respective one of the plurality of memory dies;
for each of the codewords at an additional first error parameter value, determining an additional second error parameter value associated with a respective first drift time and associated with a respective second drift time, wherein the additional second error parameter values are determined for each of the plurality of codewords at completion of at least two of the quantity of write cycles;
determining a respective probability that each of the plurality of codewords is associated with a particular one of the additional second error parameter values at the additional first error parameter value for each of the respective first drift time and second drift time;
determining a quantity of each of the plurality of codewords that are associated with each of the determined probabilities for each of the respective first drift time and second drift time;
determining a particular statistical boundary of the quantity of each of the plurality of codewords that are associated with each of the determined probabilities while performing the at least two of the quantities of write cycles; and
determining a correlation between the quantity of write cycles performed and the corresponding determined statistical boundary of the quantity of each of the plurality of codewords.

16. The apparatus of claim 8, wherein the memory device includes a stackable cross-gridded array of memory cells.

17. A system, comprising:
a memory sub-system comprising a plurality of memory components arranged to form a stackable cross-gridded array of memory cells; and
a processing device coupled to the plurality of memory components, the processing device to perform operations comprising:
performing a particular quantity of write cycles on data in one of the memory components;
determining a first statistical boundary value associated with a plurality of codeword error rate values determined at a target fail bit count value of the one memory component that is associated with a first drift time;
determining a second statistical boundary value associated with a plurality of codeword error rate values determined at a target fail bit count value of the one memory component that is associated with a second drift time; and
comparing:
the first statistical boundary value with a first error parameter values corresponding to a particular quantity of write cycles and to the first drift time; and
the second statistical boundary value with a second error parameter values corresponding to the particular quantity of write cycles and to the second drift time.

18. The system of claim 17, wherein the processing device is further configured to, in response to the first error parameter value being greater than the first statistical boundary value or the second error parameter value being greater than the second statistical boundary value, perform operations comprising retiring the one memory component.

19. The system of claim 17, wherein the processing device is further configured to perform operations comprising comparing the first error parameter value of the one memory component and the second error parameter value of the one memory component determined upon completion of a plurality of different quantities of write cycles to a first statistical boundary value and to a second statistical boundary value that are associated with each of the plurality of respective different quantities of write cycles.

20. The system of claim 17, wherein the memory components comprise memory dice.

* * * * *